(12) United States Patent
Falter

(10) Patent No.: US 6,965,093 B2
(45) Date of Patent: Nov. 15, 2005

(54) DEVICE FOR THERMALLY TREATING SUBSTRATES

(75) Inventor: Manfred Falter, Ulm (DE)

(73) Assignee: Mattson Thermal Products GmbH (DE)

( * ) Notice: Subject to any disclaimer, the term of this patent is extended or adjusted under 35 U.S.C. 154(b) by 0 days.

(21) Appl. No.: 10/399,380

(22) PCT Filed: Sep. 14, 2001

(86) PCT No.: PCT/EP01/10649

§ 371 (c)(1),
(2), (4) Date: Apr. 16, 2003

(87) PCT Pub. No.: WO02/33735

PCT Pub. Date: Apr. 25, 2002

(65) Prior Publication Data

US 2004/0089649 A1 May 13, 2004

(30) Foreign Application Priority Data

Oct. 16, 2000 (DE) .......................................... 100 51 125

(51) Int. Cl.$^7$ ................................................. F27B 5/14
(52) U.S. Cl. ........................ 219/390; 219/405; 219/411; 392/416; 392/418; 118/724; 118/725; 118/50.1
(58) Field of Search ................................ 219/390, 405, 219/411; 392/416, 428; 118/724, 725, 50.1

(56) References Cited

U.S. PATENT DOCUMENTS

| 4,698,486 A | | 10/1987 | Sheets | |
|---|---|---|---|---|
| 5,315,092 A | * | 5/1994 | Takahashi et al. | 219/497 |
| 5,862,302 A | | 1/1999 | Okase | |
| 5,951,896 A | * | 9/1999 | Mahawili | 219/411 |
| 6,081,072 A | * | 6/2000 | Suzuki | 315/46 |
| 6,191,392 B1 | * | 2/2001 | Hauf et al. | 219/411 |

FOREIGN PATENT DOCUMENTS

| DE | 3634131 A1 | 4/1987 |
|---|---|---|
| DE | 199 52 017 | 5/2001 |
| EP | 0840359 | 5/1998 |
| WO | WO 99/45573 | 9/1999 |
| WO | WO 00/30157 | 5/2000 |
| WO | WO 00/34986 | 6/2000 |

OTHER PUBLICATIONS

Article, "Self–Compensation in Rapid Thermal Annealed Silicon–Implanted Gallium Arsenide".

* cited by examiner

Primary Examiner—Shawntina T. Fuqua
(74) Attorney, Agent, or Firm—Robert W Becker & Associates; Robert W. Becker

(57) ABSTRACT

The aim of the invention is to enable substrates to be thermally treated in a more homogeneous manner. In order to achieve this, a device is provided for thermally treating substrates, especially semiconductor wafers, comprising at least two adjacent, essentially parallel heating elements which respectively have at least one heating wire. The two adjacent heating elements are embodied in such a way that they are quasi-complementary, at least in parts, in terms of the coiled and uncoiled segments of the heating wires pertaining thereto.

31 Claims, 4 Drawing Sheets

DEVICE FOR THERMALLY TREATING SUBSTRATES

BACKGROUND OF THE INVENTION

The present invention relates to an apparatus for the thermal treatment of substrates, especially semiconductor wafers, with at least two adjacent heating elements that are disposed essentially parallel to one another and are each provided with a heating filament. The apparatus is in particular related to a rapid heating unit in which the substrates are subjected to rapid temperature changes.

In the semiconductor industry, it is known to thermally treat wafers during the process of manufacturing the same. For this purpose, generally so-called rapid heating units are utilized, such as are described, for example, in DE-A-19952017, which originates from the same applicant. These units include a reactor having lamps for heating the substrates (preferably only one substrate is disposed within the reactor), and generally, although not necessarily, a process chamber (preferably of quartz glass) that is transparent for the lamp radiation and that is disposed within the reactor and surrounds the substrate. The substrate is subjected via the lamp radiation within the reactor or the process chamber to a thermal treatment pursuant to a predefined temperature-time-curve in a defined process gas atmosphere or in a vacuum. For the process result of the thermal treatment, it is very important that the wafer be heated uniformly, and that a homogeneous temperature distribution result on the wafer surface, or that a predefined temperature distribution can be realized as well as possible. Deviations from a homogeneous temperature distribution over the substrate are especially advantageous for silicon wafers if the process temperatures exceed 1200° C. and the heating and cooling rates are greater than 50° C./s. Under these process conditions, it has been shown that in the region of the final temperature an approximately parabolic temperature distribution having a temperature difference of about 5 to 20° C. (as a function of the diameter of the wafer) over the wafer diameter provides the best process results with regard to freedom of slip. However, such uses with desired, defined non-homogeneous temperature distribution over the wafer or the substrate are more the exception, since these processes entail the greatest demands on the regulatability and the temperature measurement of the substrate temperature, which only the most modern plants today can fulfill.

Primarily during the heating and cooling phases, there occurs with disc-shaped wafers the problem of very non-homogeneous temperature distributions, especially in the edge region of the wafer, which cannot be controlled or can be controlled only inadequately. Thus, the edge of the wafer heats much more significantly and rapidly during the heating phase than does the inner portion of the wafer. This more rapid heating-up is due to the fact that at the edge of the wafer, a larger outer surface per volume of wafer is provided than in the interior of the wafer. Via this additional outer surface, the edge of the wafer absorbs more of the heat radiation than does the interior of the wafer (edge effect). Furthermore, the edge of the wafer is irradiated by a larger wall surface of the reactor, essentially via reflection of radiation, and "shadows" the interior of the wafer. Due to the reactor walls, the edge region of the wafer is thus irradiated that much more intensely the higher is the reflectivity of the wall surfaces. Thus, during heating-up of the wafer, the edge of the wafer, in addition to the pure "edge effect", is additionally heated due to the presence of the reactor walls.

Since the reactor walls of rapid heating units are usually cooled (cold wall reactors), and the wall temperature is generally less than 100° C., the reactor walls have a relatively low thermal inherent or characteristic radiation relative to the reflected radiation, as a result of which the influence thereof during usual process temperatures of greater than 400° C. can be disregarded.

On the other hand, during the cooling phases the wafer cools more rapidly at the edge of the wafer than in the interior of the wafer, since via the larger surface per wafer volume at the edge, more thermal radiation is emitted. In addition, surfaces of the reactor chamber that are disposed across from the substrate and are generally arranged parallel to the substrate reflect the radiation energy given off from the wafer back to the center of the wafer in a reinforced manner, thereby further slowing down the already slow cooling-off of the center of the wafer. This slowing down is that much greater the more reflective are the surfaces, or the more these surfaces radiate thermal energy. The influence of the edge of the wafer and of the process chamber walls upon the homogeneity of the temperature is also designated as the photon-box-effect, and is, among other things, essentially a result of the reflection of a portion of the heat radiation at the reflective chamber walls, and is included in the main problems during the rapid heating of semiconductor substrates, especially if during the entire duration of the process, in other words also during the dynamic phases of the heating-up and cooling-off, an as uniform as possible or a predefined temperature distribution (which itself can again be a function of the temperature) is to be achieved over the wafer.

From the aforementioned DE-A-19952017 it is known to surround the wafer with a compensation ring in order to reduce the photon-box-effect. In particular, the compensation ring is tilted as a function of the progress of the process in order to achieve a shadow effect relative to the lamps at the edge of the wafer. In addition to this approach, it is also known to provide light-transforming plates, also knows as hot-liners, parallel to the wafer in order to indirectly heat the wafer via such plates, and hence to reduce the photon-box-effect. However, these approaches can only partially reduce the photon-box-effect, and they lead to a complicated construction of the rapid heating unit.

In the known rapid heating units, rod-shaped tungsten-halogen heating lamps are generally utilized. The heating lamps are provided with a tungsten filament that is kept in a halogen-containing atmosphere. During the operation of the lamps, tungsten from the filament is volatilized and reacts with gas molecules to form tungsten halide. During the operation of the lamps below approximately 250° C., a condensation of the tungsten on the lamp tubes can occur, which, however, can be avoided if the lamp glass is kept in a temperature range between 250° C. and 1400° C. The condensation should be avoided, since a fog connected therewith on the glass adversely affects the heating process and the service life of the lamps. If the tungsten halide comes into the vicinity of the filament, sufficient thermal energy is applied to break the chemical bond and to again deposit the tungsten upon the filament. Subsequently, the halogen gas can repeat the process. This cycle is known as the halogen process.

With the conventional rod-shaped tungsten-halogen lamps, the filament extends approximately in the center of the lamp cross-section along the longitudinal axis of the lamp, and is uniformly spirally coiled essentially over the entire length of the lamp. Only in the end regions are linear filament sections provided for the transition into the respective lamp socket. As a result, an essentially uniform heating capacity can be achieved over the entire length of the lamp, which, however, contributes to the aforementioned photon-box-effect since, as mentioned above, with a uniform heating capacity over the surface of the wafer the edge region is heated more pronounced than is the central region.

With the aforementioned DE-A-19952017 the wafer that is to be treated is furthermore disposed in a process chamber that comprises quartz glass, whereby the heating lamps are disposed outside of the process chamber. The quartz glass is transparent for the radiation emitted from the heating lamps. After a heating of the wafer within the process chamber, the wafer emits a short wave thermal radiation in the range of 0.3 to 4 $\mu$m, as well as a longer wave thermal radiation in the infrared range of greater than 4 $\mu$m. The quartz glass of the process chamber is not entirely transparent for this longer wave thermal radiation of greater than 4 $\mu$m, and therefore a large portion of this thermal radiation is absorbed by the quartz glass. Thermal radiation that is not absorbed is reflected back to the chamber, and again a large portion is absorbed in the quartz glass. A remainder falls on the wafer and is absorbed thereby. Due to the absorption of the thermal radiation in the quartz glass, there is a localized heating-up of the process chamber, especially in a region of the process chamber that is disposed directly above or below the wafer. This effect is further reinforced by a reflection of the thermal radiation at the reflective chamber walls of the unit, since the thermal radiation is essentially reflected directly back to the wafer, so that a region of the process chamber that essentially corresponds to the projected shape (i.e. having the same circumferential shape) of the substrate is heated significantly more than regions disposed beyond this region. This process again reinforces the so-called photon-box-effect, especially if the process chamber is greatly heated up, so that it irradiates back to the wafer within the chamber. This return radiation prevents a rapid cooling of the wafer, especially in the middle of the wafer. The process chamber of quartz acts as a sort of energy trap for the long wave thermal radiation, whereby due to a coupling between wafer and process chamber the central region of the wafer is always irradiated more strongly, since the process chamber walls that are disposed approximately across from this region are at a higher temperature than are the other process chamber walls. This makes it clear that a non-homogeneous temperature distribution of the process chamber (e.g. of quartz) has an influence upon the temperature distribution of the wafer. For this reason, it is attempted to cool the process chamber as homogeneously as possible. However, the process chamber temperatures can readily reach a range of 600° C.

Proceeding from the aforementioned state of the art, the object of the present invention is to provide an apparatus for the thermal treatment of substrates, especially semiconductor wafers, that enables a more homogeneous or defined heating of the substrate that is to be treated.

SUMMARY OF THE INVENTION

Pursuant to the present invention, this object is realized with an apparatus for the thermal treatment of substrates, especially semiconductor wafers, having at least two adjacent heating elements that are disposed essentially parallel to one another and are each provided with a heating filament, wherein the two adjacent heating elements, at least in part, are embodied approximately complementary to one another with respect to the coiled and uncoiled sections of their heating filament.

The complementary configuration of the heating filaments of the two adjacent heating elements means that at least one coiled section of the filament of a heating element is disposed entirely or at least partially in the region of an uncoiled section of the heating filament of the adjacent heating element. Conversely, an uncoiled section of the heating filament of a heating element can be disposed entirely or at least partially in the region of a coiled section of the heating filament of the adjacent heating element.

By providing uncoiled and coiled sections of at least two adjacent heating elements that are disposed approximately parallel to one another, whereby the sections are embodied approximately complementary to one another, it is possible to achieve over the surface of the wafer, especially along the filaments, differently controllable radiation intensities, which can be used to reduce the photon-box-effect. The irradiation characteristics of the filaments of the at least two heating elements can be adapted to the temperature conditions that exist in or on the wafer by appropriate activation with electrical power. Mechanical additional elements, such as, for example, a compensation ring or a hot-liner, for reducing the photon-box-effect, can be eliminated.

The present invention advantageously offers the possibility, with an appropriate arrangement of the adjacent heating elements, for the latter to heat the wafer in such a way as if it was being irradiated from a single heating element, i.e. as if only a single heating filament were present that, however, due to the approximately complementary sections is controllable with respect to its irradiation intensity if the individual heating elements are individually electrically activated. This considerably broadens the ability to regulate in comparison to previous rapid heating units having rod-shaped lamps without having to reduce the previous power features of the units, since the units can at any time be operated in such a way as if they were equipped with conventional rod lamps.

The filament of a heating element preferably has n coiled sections and m uncoiled sections, whereas the filament of the adjacent heating element has m coiled and n uncoiled sections, whereby n and m are respectively integers. This enables a complimentary arrangement of coiled and uncoiled sections of adjacent heating elements. The coiled sections of the one filament of a heating element are preferably respectively disposed at least partially in the region of the uncoiled sections of the filament of the adjacent heating element. In so doing, the coiled sections of the filaments can overlap at most 30% of their sectional length or 10% of the diameter of the substrate that is to be treated. In the same manner, the uncoiled sections of filaments preferably overlap at most 10% of the diameter of the substrate that is to be treated. One embodiment of the invention can also have no overlapping of the correspondingly complimentarily embodied sections. The degree of overlap depends upon how close to one another the filaments that are complimentarily embodied relative to one another are, and what requirements are prescribed relative to the permissible deviations of the desired temperature distribution upon the wafer.

Pursuant to a preferred embodiment of the invention, the filaments are symmetrical relative to a plane of symmetry that centrally intersects the longitudinal axis of the filaments and is perpendicular thereto, with this being done to obtain a symmetry that is adapted to the substrate. Preferably, respectively at least two adjacent inventive heating elements are associated with one another on at least one side and form a group. In this connection, the heating elements of a group are preferably provided with a common socket in order to hold the grouped heating elements in a defined position relative to one another. The heating elements of a group can advantageously be individually electrically activated in order in this manner to be able to control the spatial irradiation profile along the axis of the heating elements of the group. Furthermore, the individual groups can similarly be individually electrically activated in order to be able to also control the irradiation profile of the groups in the direction of the extension of the groups. The groups are advantageously disposed approximately parallel to one another and parallel to a plane that is advantageously a surface of the wafer. By appropriate activation of the groups and the heating elements within a group, the possibility is provided, not only in the longitudinal direction of the heating elements but also in the direction perpendicular thereto, of controlling or regulating the intensity of the irradiated power. In this way, it is possible to generate different irradiation profiles over the surface of the substrate. The respective filaments advantageously have a constant electrical resistance per unit of length in order over the length of the coiled section of the filament to produce a constant irradiation intensity. Deviations herefrom can also be advantageous, especially the density and/or type of coiling of the coiled sections can be non-homogeneous.

At least one heating element advantageously has at least two chambers for accommodating the filament, and in particular a plurality of chambers that are separated from one another for accommodating different sections of the filaments. By providing different chambers, the halogen process can be optimally established in the respective chambers, especially taking into consideration the respective filament section. Especially in the region of the uncoiled sections of the filaments there exists the danger of condensation of the tungsten on the lamp tube, since in the region of the uncoiled sections there is a lesser heating than in the region of the coiled sections. For a good control of the halogen process as a function of the different sections, a different pressure and/or a different gas is provided in at least two of the chambers.

To achieve a homogeneous temperature distribution upon the surface of the substrate, the filament of a heating element preferably has a centrally disposed, coiled section with adjoining uncoiled sections, whereas the filament of the adjacent heating element has a corresponding uncoiled central section and two adjacent coiled sections. As a result of this arrangement, a different heating-up of the edge regions of the substrate relative to the central region is made possible in order to counteract the aforementioned photon-box-effect. In this connection, the coiled central section of the one filament preferably has a length of approximately ⅕ of the diameter of the substrate that is to be treated. The coiled sections that are adjacent to a central, uncoiled section preferably have a length of approximately ⅓ of the diameter of the substrate that is to be treated.

For a good and uniform heating-up of the substrates, the heating elements are preferably rod lamps, the filaments of which deviate from the longitudinal axis of the lamps by less than one millimeter.

The object of the invention is realized with an apparatus for the thermal treatment of substrates, especially disc-shaped semiconductor substrates, which apparatus has a housing that forms an oven chamber, at least one radiation source within the oven chamber, and a process chamber for accommodating the substrate that is to be treated, whereby the process chamber is essentially transparent for the radiation of the radiation source, and whereby the housing has inner walls that are reflective for the radiation, in that at least one inner wall of the housing, which is disposed approximately parallel to a plane of the substrate that is to be treated, has at least two zones having different reflection characteristics, whereby at least one zone essentially corresponds to the projected shape of the substrate. By providing the different reflection characteristics, a local heating-up of the process chamber, which is caused by thermal radiation that is emitted from the substrate and that is partially absorbed by the process chamber and reflected at the inner walls of the housing, can be reduced. Due to the fact that one zone essentially corresponds to the projected shape of the substrate, a local heating-up of the process chamber directly above the substrate, especially in a region that essentially corresponds to the projected shape of the substrate, can be reduced.

Preferably, the light incident in one zone is reflected in an essentially diffused manner, as a result of which a uniform distribution results within the oven chamber of the thermal radiation that is emitted from the substrate and is reflected in the one zone. To achieve this effect, the zone of the inner wall is preferably blasted with sand or abrasive, or is roughened by some other chemical, electrochemical, or mechanical process.

Pursuant to one embodiment of the invention, the one inner wall has a shape that is different from the projected shape of the substrate, for example having a quadratic shape in comparison to a round substrate shape. The one zone preferably corresponds essentially to the size of the substrate.

The object of the present invention is also realized with an apparatus for the thermal treatment of substrates, especially disc-shaped semiconductor substrates, which apparatus has a housing that forms an oven chamber, at least one radiation source within the oven chamber, and a process chamber for accommodating the substrate that is to be treated, wherein the process chamber is essentially transparent for the radiation of the radiation source, in that at least one wall of the process chamber that is disposed essentially parallel to a plane of the substrate that is to be treated is provided with at least two zones having different optical characteristics, whereby one zone advantageously essentially corresponds to the projected shape of the substrate. In this way, localized heating of the process chamber wall above and below the substrate due to the thermal radiation given off from the substrate can be reduced, and hence an overheating of the central portion of the substrate can be counteracted.

Pursuant to one embodiment of the invention, the one zone is essentially transparent for the thermal radiation given off by the substrate in order in this manner to avoid a local heating-up especially in this region. In this connection, the one wall of the process chamber preferably has a shape that is different from the projected shape of the substrate, and the one zone corresponds essentially to the size of the substrate.

BRIEF DESCRIPTION OF THE DRAWINGS

The invention will be described subsequently in greater detail with the aid of preferred embodiments with reference to the drawings; shown in the drawings are.

DESCRIPTION OF PREFERRED EMBODIMENTS

Figure 1:
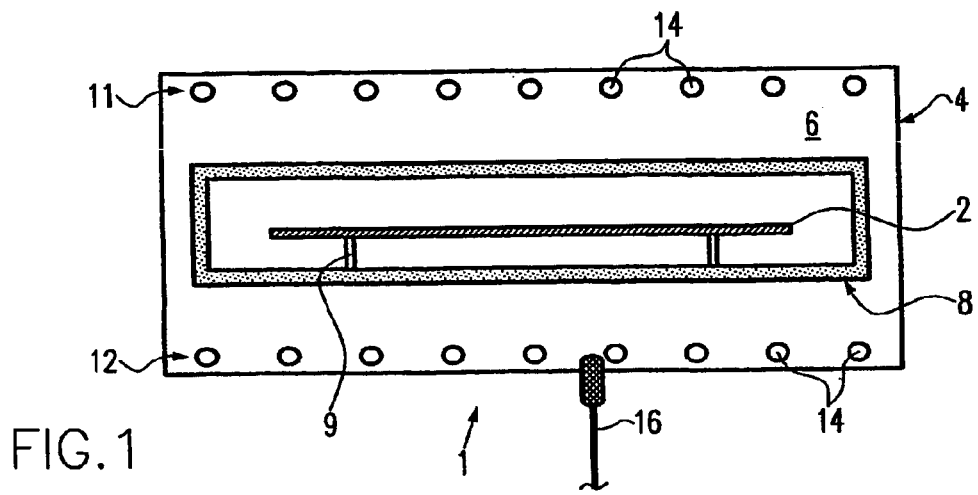
FIG. 1 a schematic cross-sectional view from the front through a rapid heating unit.

FIG. 1 schematically shows the overall construction of a rapid heating unit 1 for semiconductor wafers 2. The rapid heating unit has an only schematically indicated housing 4 (which can also be designated as a reactor) that internally defines an oven chamber 6. The inwardly facing walls of the housing can be coated at least partially in order to form a reflector chamber. Provided centrally within the oven chamber 6 is a process chamber 8 that is comprised of transparent quartz glass. Within the process chamber 8, the wafer 2 that is to be treated is placed upon appropriate support elements 9. The housing 4, as well as the process chamber 8, each have non-illustrated, closable openings for the introduction and removal of the wafers 2. Furthermore, non-illustrated gas lines are provided for conveying process gases into and out of the process chamber 8.

Provided above and below the process chamber 8 are banks of lamps 11,12, which are each formed by a plurality of rod-shaped tungsten halogen lamps 14. Although this is not illustrated in FIG. 1, it is also possible to provide banks of lamps or individual tungsten halogen lamps 14 to the sides of the process chamber 8. It is, of course, to be understood that in place of the rod-shaped tungsten halogen lamps, it would also be possible to use other lamps.

The wafer that is disposed in the process chamber 8 is heated by the electromagnetic radiation emitted from the banks of lamps 11,12. A pyrometer 16 is provided for measuring the wafer temperature.

Figure 2:
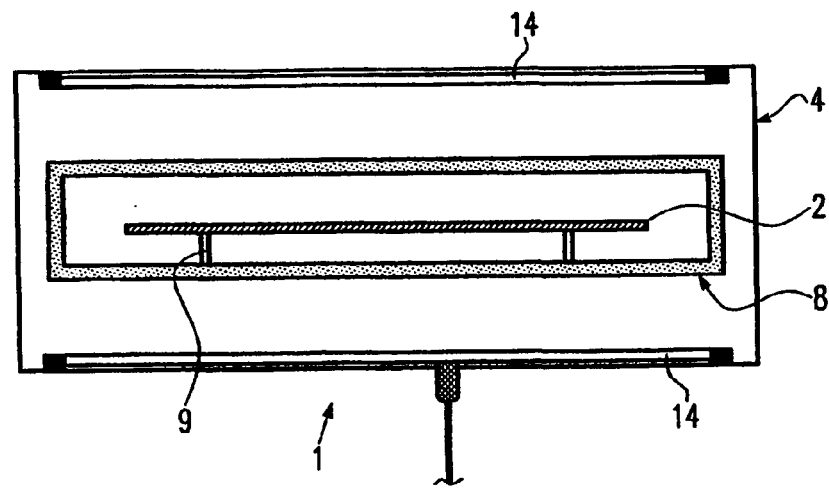
FIG. 2 a schematic cross-sectional view from the side through a rapid heating unit.
Figure 3:
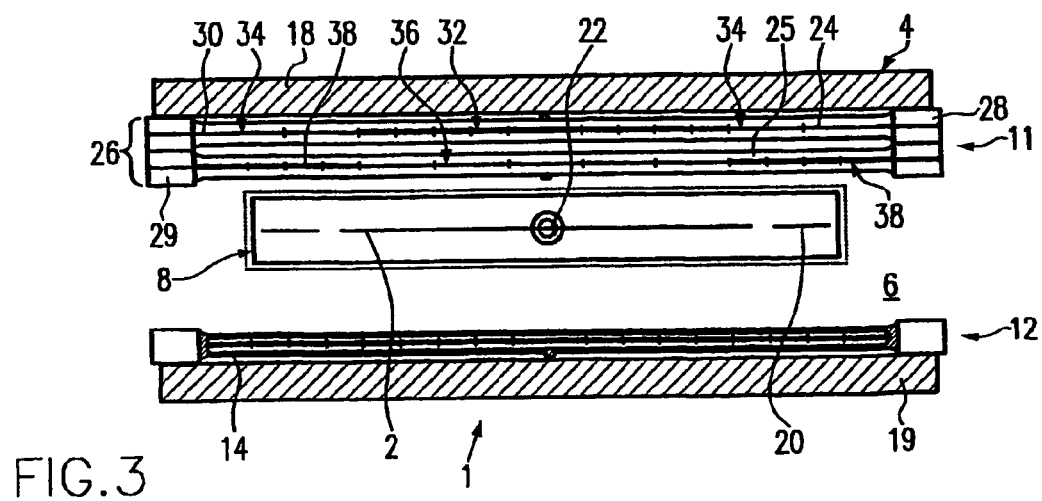
FIG. 3 a schematic cross-sectional view through a rapid heating unit, whereby lamps pursuant to the present invention are shown in an upper bank of lamps.

With reference to FIG. 3, a special embodiment of a rapid heating unit pursuant to the present invention will now be described, with this embodiment in general having the same construction as does the previously described rapid heating unit. Therefore, the same or similar elements have the same reference numerals as used in conjunction with the description of the rapid heating unit of FIGS. 1 and 2.

The rapid heating unit 1 has a housing 4, of which only an upper wall 18 and a lower wall 19 are illustrated. The housing 4 forms an oven chamber 6 in which is disposed a process chamber 8 comprised of quartz glass. Disposed within the process chamber 8 is a semiconductor wafer 2 that is surrounded by a compensation ring 20 that is disposed on the plane of the semiconductor wafer 2. Also indicated in FIG. 3 is a gas inlet or outlet opening 22 for conveying process gases into or out of the process chamber 8.

Provided above and below the process chamber 8 are banks of lamps 11,12. Disposed in the lower bank of lamps 12 is a plurality of conventional tungsten halogen lamps 14, only one of which is shown in FIG. 3.

In the upper bank of lamps 11, each two differently segmented lamps 24,25 form a lamp group 26, which can also be designated as a multiple lamp. The lamp bulbs or tubes of the lamps 24,25 are secured to common lamp sockets 28,29. The lamp socket 28, as well as the lamp socket 29, each have a non-illustrated connection by means of which not only the lower but also the upper lamps 24, 25 can be activated. The lamps, with their common socket, can be dimensioned such that they can be used in lamp-receiving means of existing rapid heating units, thereby enabling a retrofitting of existing systems. The connection is such that the upper and lower lamps can be activated separately from one another, in other words individually and independently of one another. Alternatively, it is, of course, also possible to provide for each of the lamps its own socket having its own connection.

The upper lamps 24 are provided with a heating wire or filament 30 having a coiled central portion and uncoiled or at least much less coiled sections 34. The coiled section 32 is disposed entirely in the region of the wafer 2. The uncoiled or much less coiled sections 34 adjoin the coiled section 32 to the left and to the right, and overlap an edge region of the wafer 2.

The lamp 25 has an uncoiled or not very coiled central section 36, and coiled edge sections 38. The uncoiled central section 36 of the lamp 25 extends over the same range as does the coiled central section 32 of the lamp 24. In the same manner, the coiled edge sections 38 of the lamp 25 extend over the same region as do the uncoiled sections 34 of the lamp 24.

The coiled and uncoiled sections of the lamps 24 and 25 are thus complementary to one another. As a result of different activation of the lamps 24 and 25, it is possible in a straightforward manner to achieve a different heating of the central portion of the substrate relative to the edge portion thereof. During a heating-up phase, for example, the lamp 24 can be activated more pronounced than is the lamp 25, as a result of which a higher irradiation intensity occurs in the central portion of the wafer 2 relative to the edge portion thereof. Consequently, the photon-box-effect can be reduced during the heating-up phase. During the controlled cooling-off of the wafer 2, in other words, during the cooling-off accompanied by simultaneous irradiation via the lamps 24,25, the lamp 25 can now be activated more pronounced than is the lamp 24, as a result of which a greater irradiation intensity occurs in the edge portion of the wafer 2 than in the central portion thereof. This reduces a more rapid cooling-off of the edge region and hence reduces the photon-box-effect.

The filaments of the lamps have a constant electrical resistance per unit of length of the filament over the entire filament length, so that the coiled regions irradiate with the same intensity at the same activation. Alternatively, however, the filaments could also have a different electrical resistance per unit of filament length in order to achieve different irradiation intensities. In this way, a wide adaptation of the irradiation characteristics can be achieved.

Although this is not illustrated in FIG. 3, during the thermal treatment the wafer 2 can be rotated in the plane of the wafer in order to achieve an even more uniform temperature distribution over the surface of the wafer.

Figure 4:
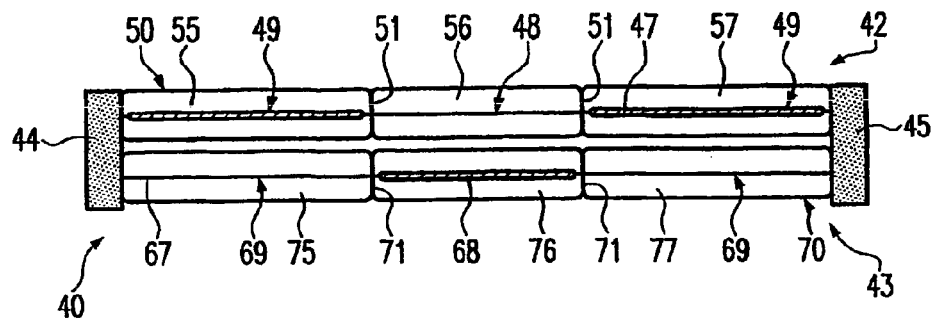
FIG. 4 a schematic view of a lamp group pursuant to the present invention.

FIG. 4 schematically shows an embodiment of an inventive lamp group 40 which can be used, for example, in place of the lamp group 26 shown in FIG. 3. The lamp group 40 has an upper lamp 42 as well as a lower lamp 43, which are respectively secured at their respective ends to a common socket 44, 45. The heating wire or filament 47 of the upper lamp has an uncoiled central section 48, as well as respective coiled edge sections 49 adjoining the central section. The upper lamp 42 has a lamp tube 50 that is comprised of quartz glass and that, via partitions 51 that extend transverse to the longitudinal axis of the lamp, forms three chambers 55, 56, 57 that are separated from one another. The length of the chambers 55 and 57 centrally corresponds to the length of the coiled edge sections 49 and accommodates the same. The middle chamber 56 has a length that essentially corresponds to the length of the central, uncoiled section 48 of the filament 47 and accommodates the same.

A different gas atmosphere (gas composition and/or pressure) is found in the chambers 55 and 57 than in the chamber 56. If the filament 47 of the upper lamp is activated, this filament, due to the coiled edge regions 49, is heated more pronounced in the coiled edge sections 49 than in the uncoiled central section 48. In order nonetheless to provide a stable halogen process over the entire length of the lamp, there is provided in the middle chamber 56 a gas atmosphere that enhances a halogen process even at low temperatures. The gas atmospheres in the respective chambers are adapted to the expected heating of the respective filament sections.

The lower lamp 43 is provided with a heating wire or filament 67 having a coiled central section 68 and uncoiled edge sections 69 that are complementarily disposed relative to the coiled and uncoiled sections 49, 48 of the lamp 42. In the same manner as the lamp 42, the lamp 43 has a lamp tube 70 that is divided into different chambers 75, 76, 77 via partitions 71 that extend transverse to the longitudinal axis of the lamp. The outer chambers 75 and 77 accommodate the uncoiled sections 69 of the filament 67, while the middle chamber 76 accommodates the coiled section 68 of the filament 67. The chambers 75 and 77 again have a different gas atmosphere than does the chamber 76.

The separation of the chambers can be effected, for example, by metal, glass or ceramic partitions that are sealed into the lamp tube. Alternatively, however, a tapering of the lamp tube can also effect a separation of the chambers without additional elements.

Figure 5:
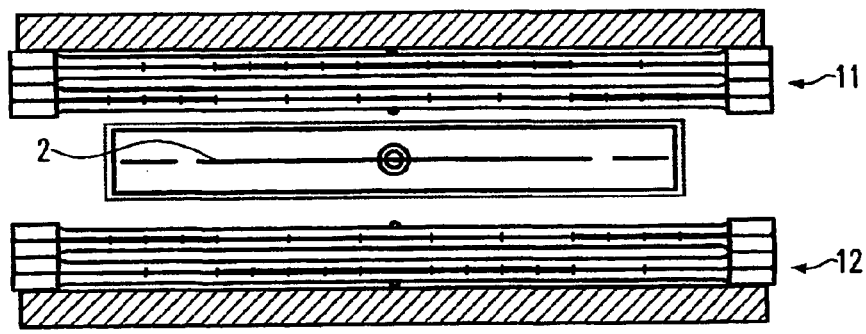
FIG. 5 a schematic cross-sectional view through a rapid heating unit pursuant to the present invention having different segmented lamp groups in the upper and lower banks of lamps.

FIG. 5 shows an alternative embodiment of a rapid heating unit 1 that is essentially constructed the same as the rapid heating unit 1 of FIG. 3. In contrast to the embodiment of FIG. 3, with the embodiment of FIG. 5 also for the lower bank of lamps 12 each two lamps form a group having complementarily arranged coiled and uncoiled sections. Thus, provided above and below a substrate 2 are banks of lamps 11, 12 that are provided with complementarily segmented and grouped lamps.

Figure 6:
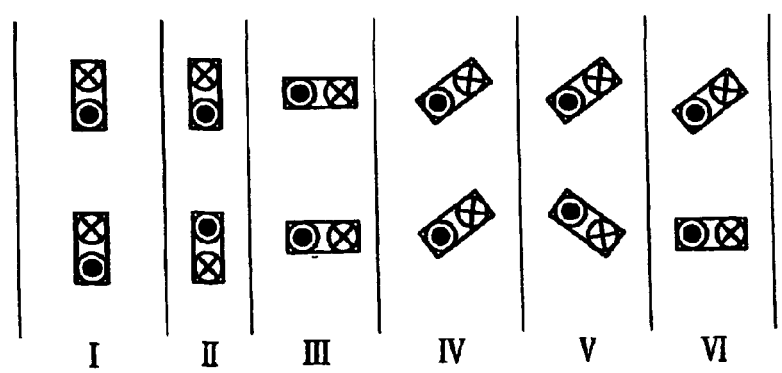
FIG. 6 a schematic illustration of different arrangement possibilities of lamp groups in the upper and lower banks of lamps in a rapid heating unit.

FIG. 6 illustrates different possibilities for arranging the groups that comprise two complementarily segmented lamps. With regard to the lamp groups, the circle that contains the cross respectively represents a lamp having a centrally coiled section and uncoiled or less greatly coiled edge sections, whereas the circle having the filled-in point represents a lamp having a non-coiled or slightly coiled central section and coiled or more greatly coiled edge sections. The examples I and II represent the presently preferred embodiment of the invention, according to which the respective lamps of a lamp group are disposed on a line that is perpendicular to the plane of the wafer.

However, as illustrated in example III, it is also possible to dispose the respective lamps of a lamp group in a plane that extends parallel to the plane of the wafer.

The examples IV and V show an arrangement of the respective lamps in a plane that intersects the wafer at an angle of other than 90 degrees. With the examples I, II, III and V, the respective lamps of the lamp groups of the upper and lower bank of lamps are disposed symmetrically relatively to the plane of the wafer.

In contrast, example VI shows an arrangement of the lamps of the lamp group of the upper bank of lamps in a plane that intersects the plane of the wafer at an angle other than 90 degrees, whereas the lamps of a lamp group of the lower bank of lamps are disposed parallel to the plane of the wafer.

There thus results different possibilities for arranging the lamps within the respective lamp groups.

Figure 7:
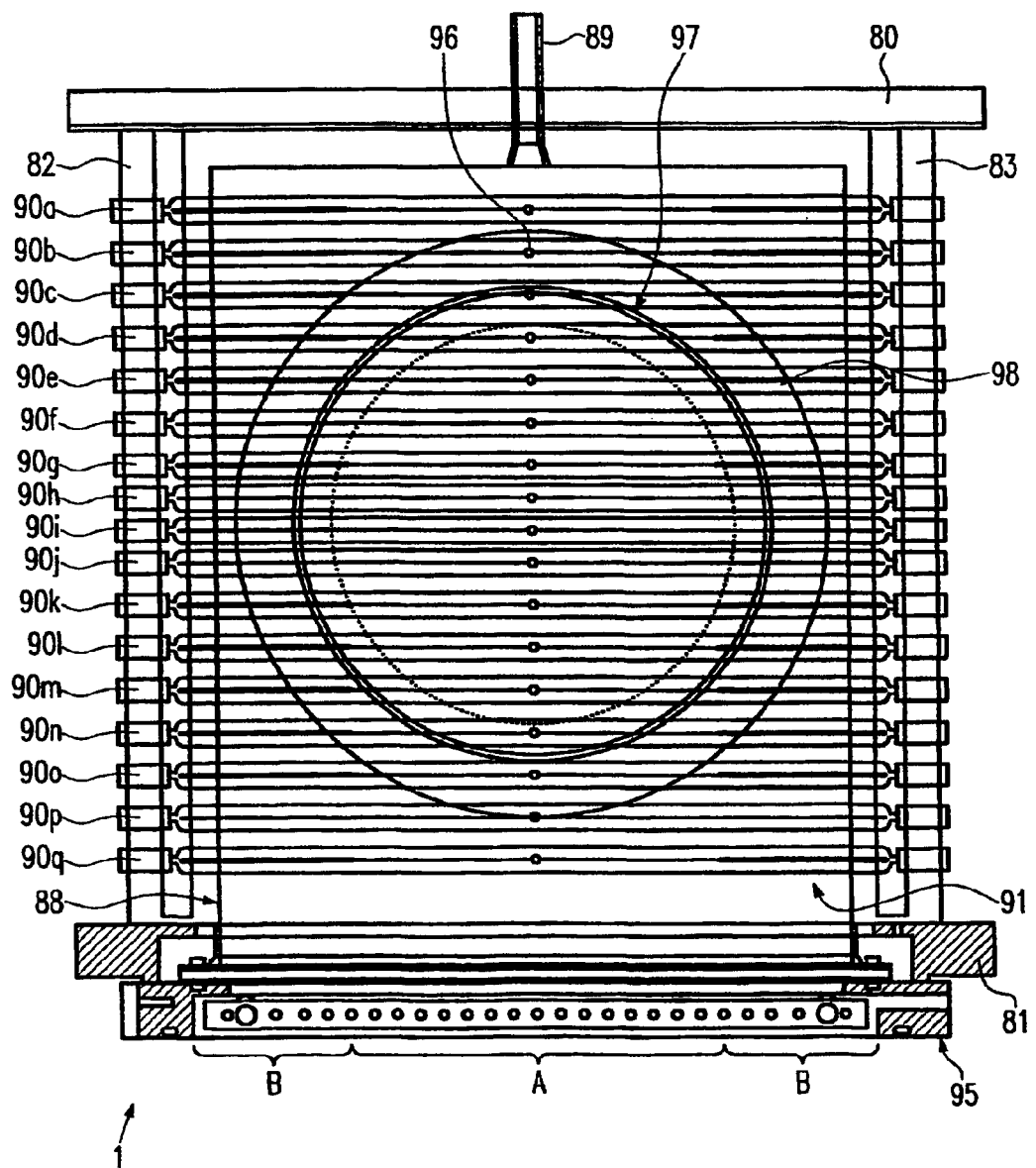
FIG. 7 a schematic plan view onto a schematic rapid heating unit having an upper bank of lamps with segmented heating lamps.

FIG. 7 shows a schematic plan view onto a rapid heating unit 1, whereby the upper wall of the oven chamber has been removed. The oven chamber is provided with end walls 80 and 81, as well as with chamber side walls 82 and 83 that connect the chamber end walls 80, 81. The chamber end wall 80 is provided with an opening for receiving and guiding a gas line 89 through that is in communication with a process chamber 88 that is disposed in the interior of the oven chamber.

Extending between the chamber side walls 82, 83, in at least two planes, are lamp pairs 90a to q (of which only the upper lamps are illustrated, and which can be disposed, for example, analogously or similarly to the lamp pairs in the bank of lamps 11 in FIG. 3) of an upper bank of lamps 91, which will be explained in greater detail subsequently. A further bank of lamps can be provided below the process chamber 88, although this is not illustrated in FIG. 7. Provided on the chamber end wall 81 is an adapter 95 for a gas discharge system. The gas discharge system in the adapter 95 is designed such that it enables a laminar gas flow within the process chamber 8. There is furthermore provided on the chamber end wall 81 a door for loading and unloading the process chamber 88.

Provided in the non-illustrated base and/or in the non-illustrated top wall of the oven chamber is a plurality of gas inlets 96 that are directed toward the process chamber 88 in order to cool the process chamber by the introduction of a gas.

A semiconductor wafer 97 is accommodated within the process chamber 88 and is radially surrounded by a compensation ring 98. The wafer is accommodated in such a way that it is rotatable about its central axis in the plane of the wafer.

As is illustrated in FIG. 7, the upper plane of the upper bank of lamps 91 is provided not only with segmented lamps, i.e. lamps having coiled and uncoiled or less greatly coiled sections of the filament, but also non-segmented lamps, i.e. lamps having a generally essentially uniformly coiled filament. In the segmented lamps, i.e. the lamps 90a, b, c, d, e, g, k, l, m, n, o, q, the respective central sections of the filaments are uncoiled or at least not greatly coiled, whereas the respective end sections are coiled. In the second plane of the upper bank of lamps 91, the lamps are inventively embodied to be complimentary to the corresponding upper lamps. In this way, essentially strip-shaped zones A and B result having different radiation intensities that are emitted from the lamps. In the central zone A there is effected a radiation essentially only via the generally uniformly coiled lamps 90f, i, j, k, and p, and via the lamps of the second plane of the upper bank of lamps that are coiled in the central region. In the edge zones B, the irradiation is effected essentially by the lamps that in the edge region include a coiled filament. Overall, the generally uniformly coiled lamps (lamp pairs) 90f, i, j, k, and p can also be replaced by pairs of complementarily segmented lamps. From the arrangement and the ratio of the number of complimentarily segmented pairs and generally coiled lamps, as well as their electrical activation, the zones A and B can be defined and their magnitude and intensity of irradiation can be controlled during the process.

As a result of this arrangement of the lamps in combination with the rotation of the wafer there result upon the surface of the wafer 97 two different irradiation zones, which are illustrated in FIG. 7 by the dotted line. Within the dotted line, i.e. in a central portion of the wafer, there is effected an irradiation essentially exclusively via the non-segmented lamps whereas in the region of the wafer disposed beyond the dotted circle, an irradiation is effected not only by the non-segmented but also by the segmented lamps, in particular the segmented lamps 90g, 90k and 90l. By means of suitable individual activation of the respective lamps it is therefore possible to heat the central portion of the wafer 97 differently (and in particular as a function of the process) from its edge region.

Such a multi-zone irradiation can also be achieved by the use of the lamp groups illustrated in FIGS. 3, 4, 5 and 6, whereby the arrangement of the lamp pairs or groups and/or of their combinations with non-segmented lamps can be combined in any desired fashion depending upon requirements. Thus, for example, the lamp pairs described in conjunction with FIG. 7 can be replaced by other groupings, such as those illustrated in FIG. 6. Furthermore, different groupings are also possible within a bank of lamps.

Figure 8:
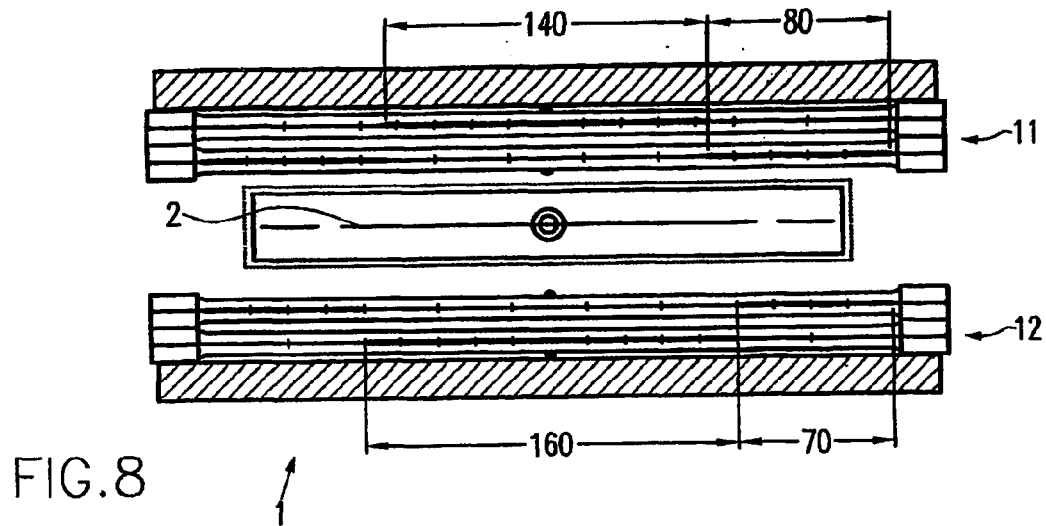
FIG. 8 a view similar to FIG. 5, whereby the individual segments of the segmented lamps in the upper and lower banks of lamps have different length ratios.

FIG. 8 shows a schematic cross-sectional view of a further embodiment of a rapid heating unit 1 pursuant to the present invention, which has a similar construction to the rapid heating unit 1 of FIG. 5. The single difference lies in a different ratio of the lengths of the coiled and uncoiled sections in the lamp groups of the upper bank of lamps 11 and the lamp groups of the lower bank of lamps 12. The illustrated sectional lengths are provided in millimeters and are provided for a rapid heating unit for wafers 2 having a diameter of 200 mm. For the lamp group of the upper bank of lamps 11 the length of the central section is 140 mm, whereas the edge sections respectively have a length of 80 mm. For the lamp group of the lower bank of lamps 12 the central section has a length of 160 mm, whereas the edge sections respectively have a length of 70 mm. Due to the different ratios of the sectional lengths there result different zones having different irradiation intensities, which enables an improved heating of the wafer 2 and a reduction of the photon-box-effect. The indicated lengths of the sections are provided only as examples and are not limiting. The sectional lengths can be adapted to the respective wafer size and the chamber geometry.

Figure 9A:
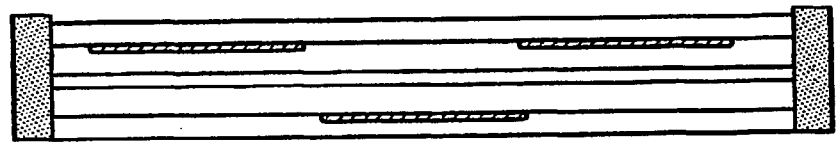
FIGS. 9a and 9b schematic illustrations of heating filaments, of heating lamps of one group of heating lamps, that are complementary in sections.
Figure 9B:
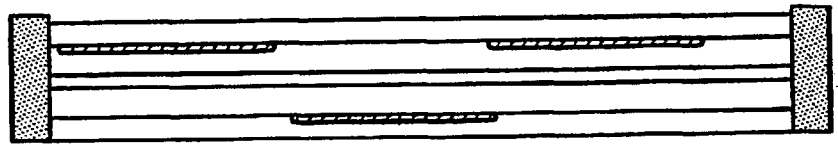

FIGS. 9a and b show two different embodiments of lamp groups each having two lamps with a lamp filament that is respectively provided with coiled and uncoiled sections. As can be seen in FIGS. 9a and b, the coiled and uncoiled sections of the two lamps of a lamp group are, however, only partially complementary. Thus, pursuant to FIG. 9a, for example, with both lamps of the lamp group an edge region having uncoiled sections of the respective filament are provided. Furthermore, the coiled central section of the lower lamp does not entirely overlap the uncoiled central section of the upper lamp. At the same time, the coiled central section of the lower lamp slightly overlaps the right coiled section of the upper lamp.

Due to the different arrangement of the coiled and uncoiled regions, different irradiation profiles of the lamp groups can be provided that can be adapted to the respective processes and the chamber geometries.

Pursuant to one possible overlapping of coiled or non-coiled sections of adjacent lamps of a lamp group, this overlapping should be less than 30% of the section length or 10% of the substrate diameter.

Figure 10:
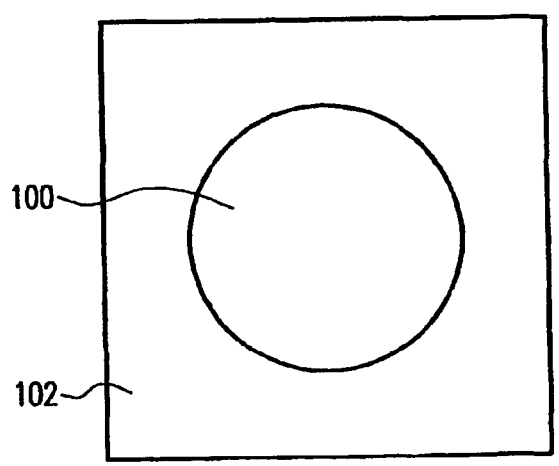
FIG. 10 is a schematic plan view onto an oven chamber wall having zones of different reflection characteristics.

FIG. 10 shows a schematic illustration of an upper or lower oven chamber wall of a rapid heating unit 1, which wall is disposed parallel to the plane of the wafer. FIG. 10 shows the inner chamber wall, which, as described previously, can be reflective or coated. The reflective character is effected, for example, by a coating with gold or a dielectric material. In this connection, the inner side of the oven wall has, however, a central region 100 that has a shape that corresponds to the projected shape of the wafer that is to be treated. In the illustrated embodiment, a circular shape is provided. Notches or flats provided on the wafer are not necessarily taken into consideration for the design of the central region 100.

The central region 100 is surrounded by an outer region 102. The regions 100 and 102 are provided with different reflective characteristics. In particular, the central region 100 reflects incident light in a diffused manner and/or has a lower reflection coefficient than does the outer region. There is preferably reflected in the outer region 102 a normal (specular) reflection. In general, the regions can also differ in the spectral nature of their optical characteristics, e.g. in the spectral nature of the refraction index and/or in the reflection coefficients, whereby, for example, a reflection coefficient integrated over a specific wave length range can be continuously uniform or similar. The central region 100 can, for example, be treated by sandblasting or streams of abrasive in order to obtain the diffused reflection characteristics. The spectral nature of the optical characteristics can be influenced, for example, via different coatings of the central and outer regions.

The size of the central region 100 essentially corresponds to the size of the substrate that is to be treated, whereby this is again a function of the dimensions of the process chamber or reactor. If the reflecting and/or refracting surfaces are at a distance of less than 30% from the surface of the wafer, the central region is between 70% and 130% of the wafer diameter. Included in the selection of the suitable diameter are the optical characteristics of the wafer, the arrangement of the banks of lamps, and the temperature-time curves of the intended process. One tries to undertake a selection that is largely independent of the first and last, whereby the parameters for the central region are then as indicated. It can furthermore be advantageous to provide more than two regions with different optical characteristics and/or to continuously vary the optical characteristics, so that, for example, the reflection coefficient of the outer region continuously increases or decreases toward the outside.

Inner oven walls having regions of different reflectivity lead, during longer processes, to a more homogeneous distribution of the temperature over the surface of the wafer. Even during short, so-called flash processes, an improved homogeneity of the distribution of the temperature of the wafer can be achieved. Furthermore, with units having such modified chamber surfaces, the banks of lamps having conventional non-segmented lamps, all of the lamps of a bank of lamps can be activated with nearly the same electrical power. Up to now, the lamps were differently activated to reduce edge effects. The uniform activation leads to an increase of the service life of the lamps. In addition, with the same electronic power mechanisms, a larger process window or a larger control or regulation region is achieved, since all of the lamps can be activated essentially identically. In this way, situations are avoided where a lamp having 40% power is irradiating, while another lamp is irradiating with 80% power, as a result of which a maximum increase of the irradiation capacity, with the irradiation conditions between the lamps remaining the same, results. With a uniform activation of the lamps, the regulation regions of the lamps can be better utilized. This increases the process dynamic and the regulation region. In this connection, none of the lamps should significantly differ upwardly or downwardly from an average value, i.e. the lamp capacities are disposed approximately within a capacity or power window of about 20% about the average value. A further increase of the process window can be achieved by a lower loading of the lamps, if utilized, that are mounted on the side inner walls of the oven. Instead of a loading of nearly 100%, as is normally customary for these lamps, the side lamps are loaded, for example, only to 30% for processes in an oven that has regions of different reflectivity. If in addition to the oven regions that are prepared by sandblasting or streams of abrasive, the banks of lamps are equipped with the inventive lamp groups or multiple lamps, it is possible to still further increase the homogeneity of the temperature with their help if the irradiation characteristics of the individual heating bodies, and thus the irradiation field within the oven chamber, are adapted by zones to the process requirements.

In a similar manner, the chamber walls of the process chamber, which is comprised of quartz, and which chamber walls are disposed parallel to the plane of the wafer, can also be provided with regions having different optical characteristics, whereby one region has a projected shape in conformity with the wafer that is to be treated. The different optical characteristics can, for example, include a different refraction, especially of the thermal radiation emanating from the wafer, and/or a different absorption magnitude of the thermal radiation emanating from the wafer. In this way, there is avoided that the chamber wall that is disposed parallel to the wafer is locally heated up more in the region above or below the wafer than are other regions of the process chamber, which would reinforce the previously described photon-box-effect.

The invention was previously described in detail with the aid of preferred embodiments of the invention without being limited to the specifically illustrated embodiments. The heating unit can, for example, be utilized for RTP-, CVD-, RTCVD-, or epitaxial processes. The previously mentioned features can be combined with one another in any compatible manner. In particular, the chamber wall having different reflectivities, or the process chamber wall having different optical characteristics, can be combined with the various lamp forms.

The specification incorporates by reference the disclosure of German priority document 100 51 125.2 filed 16 Oct. 2000 and PCT/EP01/10649 filed 14 Sep. 2001.

The present invention is, of course, in no way restricted to the specific disclosure of the specification and drawings, but also encompasses any modifications within the scope of the appended claims.

What is claimed is:

1. An apparatus for thermally treating substrates, comprising:

at least two adjacent rod-lamps that extend essentially parallel to one another and are each provided with at least one heating filament, each of which includes coiled and uncoiled sections, wherein at least parts of said at least two adjacent rod-lamps are embodied approximately complementary to one another with respect to said coiled and uncoiled sections of pertaining ones of said filaments, and wherein said rod-lamps have a plurality of chambers that are separated from one another and serve for receiving different sections of said filaments; and a control device for an individual activation of said filaments of adjacent rod-lamps.

2. An apparatus according to claim 1, wherein said filament of one of said rod-lamps has n coiled sections and m uncoiled sections, while the filament of an adjacent rod-lamp has m coiled sections and n uncoiled sections, where m and n are respectively integers.

3. An apparatus according to claim 2, wherein said coiled sections of said filament of one of said rod-lamps are respectively disposed at least partially in a region of said uncoiled sections of said filament of the adjacent heating element.

4. An apparatus according to claim 3, wherein said coiled or uncoiled sections of said filaments overlap by at most 10% of a diameter of a substrate that is to be treated.

5. An apparatus according to claim 1, wherein said filaments are symmetrical relative to a plane of symmetry that centrally intersects longitudinal axes of said filaments and is disposed perpendicular thereto.

6. An apparatus according to claim 1, wherein respectively at least two adjacent ones of said rod-lamps form a group the rod-lamps of which on at least one side are associated with one another.

7. An apparatus according to claim 6, wherein the rod-lamps of a group have a common socket.

8. An apparatus according to claim 1, wherein said filaments respectively have a constant electrical resistance per unit of length.

9. An apparatus according to claim 1, wherein at least one of said rod-lamps has at least two chambers for accommodating said filament thereof.

10. An apparatus according to claim 9, wherein at least one of a different pressure and a different gas is provided in at least two of said chambers.

11. An apparatus according to claim 1, wherein said filament of one of said rod-lamps has a centrally disposed coiled section, with adjoining uncoiled sections and wherein said filament of an adjacent one of said rod-lamps has a corresponding uncoiled central section with two adjoining coiled sections.

12. An apparatus according to claim 11, wherein said coiled central section of said one filament has a length of approximately ⅕ of a diameter of a substrate that is to be treated.

13. An apparatus according to claim 11, wherein said coiled sections that are disposed adjacent to a central, uncoiled section have a length of approximately ⅓ of a diameter of a substrate that is to be treated.

14. An apparatus according to claim 1, wherein the filaments of said rod-lamps which deviate from longitudinal axes of said rod-lamps by less than 1 mm.

15. An apparatus for thermally treating substrates, comprising:

at least two adjacent rod-lamps that extend essentially parallel to one another and are each provided with at least one heating filament, each of which includes coiled and uncoiled sections, wherein at least parts of said at least two adjacent rod-lamps are embodied approximately complementary to one another with respect to said coiled and uncoiled sections of pertaining ones of said filaments, and a control device for an individual activation of said filaments of adjacent rod-lamps, wherein an oven chamber is provided that surrounds said rod-lamps and is provided, for a radiation of said rod-lamps, with reflective inner walls, wherein one inner wall that is disposed approximately parallel to a plane of a substrate that is to be treated is provided with at least two zones having different reflection characteristics, and wherein at least one of said zones corresponds essentially to a projected shape of said substrate.

16. An apparatus according to claim 15, wherein said at least one zone reflects light that is incident therein in an essentially diffused manner.

17. An apparatus according to claim 15, wherein at least one zone of said inner wall is blasted with abrasive.

18. An apparatus according to claim 15, wherein one other zone has a shape that differs from said projected shape of said substrate.

19. An apparatus according to claim 15, wherein said at least one zone corresponds essentially to a size of said substrate.

20. An apparatus for thermally treating substrates, comprising:
   at least two adjacent rod-lamps that extend essentially parallel to one another and are each provided with at least one heating filament, each of which includes coiled and uncoiled sections, wherein at least parts of said at least two adjacent rod-lamps are embodied approximately complementary to one another with respect to said coiled and uncoiled sections of pertaining ones of said filaments, and a control device for an individual activation of said filaments of adjacent rod-lamps, wherein a process chamber is provided for accommodating a substrate that is to be treated, wherein said process chamber has walls that are disposed between said rod-lamps and said substrate and that are essentially transparent for a radiation of said rod-lamps, wherein a wall of said process chamber that is disposed essentially parallel to a plane of a substrate that is to be treated is provided with at least two zones having different optical characteristics, and wherein one of said zones corresponds essentially to a projected shape of said substrate.

21. An apparatus according to claim 20, wherein said one zone is essentially transparent for thermal radiation emitted from said substrate.

22. An apparatus according to claim 20, wherein said one wall of said process chamber has a shape that differs from said projected shape of said substrate.

23. An apparatus according to claim 20, wherein said one zone corresponds essentially to a size of said substrate.

24. An apparatus for thermally treating substrates, comprising:
   a housing that forms an oven chamber;
   at least one source of radiation disposed within said oven chamber; and
   a process chamber disposed in said housing for accommodating a substrate that is to be treated, wherein said process chamber is essentially transparent for radiation of said source of radiation, wherein at least one wall of said process chamber that is disposed essentially parallel to a plane of said substrate that is to be treated is provided with at least two zones having different optical properties, and wherein one of said zones essentially corresponds to a projected shape of said substrate.

25. An apparatus according to claim 24, wherein said rod-lamps have a plurality of chambers that are separated from one another and serve for receiving different sections of said filaments.

26. An apparatus according to claim 24, wherein said one zone is essentially transparent for thermal radiation emitted from said substrate.

27. An apparatus according to claim 24, wherein said one wall of said process chamber has a shape that differs from said projected shape of said substrate.

28. An apparatus according to claim 24, wherein said one zone corresponds essentially to a size of said substrate.

29. An apparatus for thermally treating substrates, comprising:
   at least two adjacent rod-lamps that extend essentially parallel to one another and are each provided with at least one heating filament, each of which includes coiled and uncoiled sections, wherein at least parts of said at least two adjacent rod-lamps are embodied approximately complementary to one another with respect to said coiled and uncoiled sections of pertaining ones of said filaments, and a control device for an individual activation of said filaments of adjacent rod-lamps, wherein said parallel-extending rod-lamps overlay the substrate parallel to a chord of a circle defined by the center of the substrate with each extent of the substrate along the chord being collectively overlade by a complementary pair of a coiled heating filament section of one rod-lamp and an uncoiled heating filament section of the other rod-lamp, and said control device individually activates said filaments of said rod-lamps such that, during a first period of the thermal treatment of the substrate, the coiled heating filaments of the one rod-lamp are activated to provide irradiation intensities that are more pronounced than the contemporaneous irradiation intensities of the other rod-lamp and, during a subsequent period of the thermal treatment of the substrate, the coiled heating filaments of the other rod-lamp are activated to provide irradiation intensities that are more pronounced than the contemporaneous irradiation intensities of the one rod-lamp, whereupon each extent of the substrate that is overlade by one of said complementary pairs of coiled and uncoiled heating filament sections is subjected to a different irradiation intensity during the first period of the thermal treatment of the substrate than during the subsequent period of the thermal treatment of the substrate.

30. An apparatus according to claim 24, further comprising:
   at least two adjacent rod-lamps that extend essentially parallel to one another and are each provided with at least one heating filament, each of which includes coiled and uncoiled sections, wherein at least parts of said at least two adjacent rod-lamps are embodied approximately complementary to one another with respect to said coiled and uncoiled sections of pertaining ones of said filaments, and
   a control device for an individual activation of said filaments of adjacent rod-lamps.

31. An apparatus according to claim 25, wherein at least one of a different pressure and a different gas is provided in at least two of said chambers.

* * * * *